United States Patent [19]
Koch

[11] Patent Number: 5,122,744
[45] Date of Patent: Jun. 16, 1992

[54] GRADIOMETER HAVING A MAGNETOMETER WHICH CANCELS BACKGROUND MAGNETIC FIELD FROM OTHER MAGNETOMETERS

[75] Inventor: Roger H. Koch, Amawalk, N.Y.

[73] Assignee: IBM Corporation, Armonk, N.Y.

[21] Appl. No.: 594,810

[22] Filed: Oct. 9, 1990

[51] Int. Cl.$^5$ .......................................... G01R 33/035
[52] U.S. Cl. .................................. 324/248; 505/846; 324/244
[58] Field of Search .................. 324/202, 225, 207.12, 324/228, 244, 245, 246, 247-253, 260-263; 505/1, 702, 842, 843, 845, 846

[56] References Cited

U.S. PATENT DOCUMENTS

| | | | |
|---|---|---|---|
| 3,110,282 | 11/1963 | Foerster | 324/244 |
| 3,311,821 | 3/1967 | Bruhel | 324/244 |
| 4,380,735 | 4/1983 | Bell | 324/225 X |
| 4,386,318 | 5/1983 | Burbank et al. | 324/245 X |
| 4,394,831 | 7/1983 | Egli et al. | 324/225 X |
| 4,528,506 | 7/1985 | Davis et al. | 324/225 |
| 4,603,365 | 7/1986 | Nakamura | 324/225 X |
| 4,623,842 | 11/1986 | Bell et al. | 324/245 |
| 4,653,033 | 3/1987 | Posseme | 324/248 X |
| 4,731,582 | 3/1988 | Posseme et al. | 324/245 |
| 4,849,695 | 7/1989 | Muller et al. | 324/252 |

OTHER PUBLICATIONS

David M. Cook, "The Theory of the Electromagnetic Field", 1975, pp. 128-137.
IBM Technical Disclosure Bulletin, vol. 23, No. 8, Jaycox et al., "Generalized Tightly Low Noise SQUID", Jan. 1981, pp. 3906-3909.
IBM Technical Disclosure Bulletin, vol. 25, No. 1, Chaudhari et al., Jun. 1982, pp. 8-14, "Use of SQUID system to Locate Resistance Leakage in Electronic Packages".
IBM Technical Disclosure Bulletin, vol. 27, No. 5, Ketchen, "Three Axis SQUID Magnetometer", Oct. 1984, pp. 2790-2791.
IBM Technical Disclosure Bulletin, vol. 27, No. 5, Jaycox et al., Oct. 1984, pp. 2822-2824, "High Spatial Resolution Magnetometer Head for . . . SQUID".
IBM Technical Disclosure Bulletin, vol. 27, No. 10A, Mar. 1985, pp. 5847-5848, "Integrated Thin-Film Miniature SQUID Magnetometer".
IBM Technical Disclosure Bulletin, vol. 29, No. 5, Oct. 1986, pp. 2314-2316, "SQUID Gradiometer Using Planar Coupling".
John Clarke and Roger H. Koch, SCIENCE, vol. 242, "The Impact of High Temperature Superconductivity on SQUID Magnetometers", 14 Oct. 1988, pp. 217-223.
John Clarke, IEEE "Advances in SQUID Magnetometers", Oct. 1980, pp. 1896-1908.
Richard F. Voss et al., J. Appl. Phys., vol. 51, No. 4, Apr. 1980, pp. 2306-2309, "All-Nb low-noise dc SQUID with 1-Mm tunnel junctions".
William A. Geyger, *Nonlinear-Magnetic Control Devices*, Chapter 14, 1964, pp. 364-377 (month unknown).

*Primary Examiner*—Kenneth A. Wieder
*Assistant Examiner*—W. S. Edmonds
*Attorney, Agent, or Firm*—Sughrue, Mion, Zinn, Macpeak & Seas

[57] ABSTRACT

A gradiometer utilizes at least three vector magnetometers (preferably SQUIDs) to measure a magnetic field gradient. The gradiometer includes a reference magnetometer and a plurality of sensor magnetometers, wherein the reference magnetometer (SQUID) is used to cancel background magnetic fields from outputs of the sensor magnetometers via a feedback loop provided with a signal from the reference magnetometer. Similarly, higher order gradiometers can be built using a reference magnetometer cube and a plurality of sensor magnetometer cubes.

16 Claims, 5 Drawing Sheets

GRADIOMETER HAVING A MAGNETOMETER WHICH CANCELS BACKGROUND MAGNETIC FIELD FROM OTHER MAGNETOMETERS

BACKGROUND OF THE INVENTION

The present invention relates to a gradiometer sensor which employs at least three vector magnetometers to measure a magnetic field gradient. More particularly, the present invention relates to a three SQUID (i.e., Superconducting Quantum Interference Device) gradiometer.

A description of a SQUID device used to sense magnetic fields is given below based on the SQUID device shown in FIG. 1. SQUID 1 comprises a superconducting loop 2 having at least one weak link (e.g., Josephson device J) which can exhibit a Josephson current. SQUID 1 is located near a SQUID input coil 3 which is electrically connected to a pick-up coil 4.

When a change in the magnetic field to be detected occurs through pick-up coil 4, a circulating current $\Delta i$ will be induced in the SQUID input coil 3. Circulating current $\Delta i$ produces a magnetic field which couples to the SQUID loop 2 and is detected. Pick-up coil 4 has an inductance $L_U$ which is approximately equal to an inductance $L_i$ of input coil 3. The inductance $L_p$ of the connecting line between input coil 3 and pick-up coil 4 (i.e., the parasitic inductance) should be very small (i.e., $L_p$ much less than $L_i$). This can be accomplished, for example, as discussed in IBM Technical Disclosure Bulletin, Volume 27 No. 5, October 1984, pages 2822-2823.

FIG. 2 is a graph of voltage vs. modulation current illustrating hysteresis present in a single SQUID device such as the one shown in FIG. 1 (at T=14° K. and at a field sweep frequency of approximately 13 Hz).

The SQUID device shown in FIG. 1 is referred to as an unlocked SQUID because there is no feedback to cancel out the background field. FIG. 3 is a graph of hysteresis ($\phi_0$) vs. field sweep amplitude ($\phi_{0}$p-p) of an unlocked SQUID at T=77° K. FIG. 3 illustrates that, as the sweep of the applied magnetic field increases, the hysteresis of the unlocked single SQUID device will also increase Therefore, SQUIDs have been "locked up" by providing feedback in order to prevent hysteresis. This is accomplished by providing feedback so that the value of the magnetic field which the SQUID sees is kept constant (i.e., the SQUID never sees a change in the magnetic field). A change in magnetic field produces a correction current which in turn produces an equal and opposite field. Such an arrangement of "locking up" SQUIDs is illustrated in FIG. 4.

A magnetic field gradient may be measured by a device which uses the output of two magnetometers separated at a distance d apart from each other. FIG. 4 illustrates such a magnetic field gradient measuring device (i.e., gradiometer). The gradiometer illustrated in FIG. 4 is a two SQUID gradiometer (known in the art as a Bare SQUID Gradiometer). Each SQUID 6a and 6b measures the magnetic field at its respective location. Amplifiers 9a, 9b, feedback coils 7a, 7b and resistors 8a, 8b (each having the same resistance $R_F$) are used to provide a correction current producing a field equal to and opposite that of the magnetic field Electronic voltages $'B_L'$ and $'B_R'$ are supplied as outputs corresponding to the magnetic field at each of SQUIDs 6a and 6b, respectively. The difference between these outputs of SQUIDs 6a and 6b is taken electronically to form the gradient. Thus, the gradient is equal to:

$$\frac{\Delta B}{d} = \frac{'B_R' - 'B_L'}{d}$$

Such a two SQUID gradiometer is easy to make, has good balance and low hysteresis. However this type of gradiometer is seldom used because the large common mode signal of the two magnetometers (from the non-gradient terms in the magnetic field) requires an almost impossible degree of common mode rejection (1 part in $10^9$) of an amplifier taking the difference in the outputs between the two SQUIDs. That is, the gradiometer of FIG. 4 is virtually impossible to operate due to the difficulty of electrically detecting a small gradient in the presence of a very large background magnetic field due to the earth's magnetic field. The gradiometer of FIG. 4 attempts to subtract two very large numbers to provide a relatively very small number as the gradient, for example, a ratio of the gradient to the background field of approximately $1:10^9$.

The electronics associated with such a gradiometer must detect the difference between two magnetic fields where the average background field is very large. This requires the electronics to detect an extremely small signal difference in the presence of a very large signal, which is very difficult and very costly.

FIG. 5 illustrates a single SQUID thin film gradiometer. Reference numbers 111 and 112 each represent thin film pick-up coils. Reference numeral 113 represents the input coil and reference numeral 114 represents a washer-type SQUID. The thin film pick-up coils 111 and 112 each intercept the magnetic field at their respective locations to determine the gradient $$\frac{\Delta H}{\Delta X}.$$

The currents produced in each of the thin film pick-up coils 111 and 112 are opposite to each other. Therefore, SQUID 114 operates as a null detector. That is, when the SQUID 114 output is equal to zero, there is no gradient. The SQUID 114 output is therefore proportional to the gradient $$\frac{\Delta H}{\Delta X}.$$

A thin film gradiometer such as the one illustrated in FIG. 5 is easy to make and has a very well known design when fabricated from low $T_c$ superconductive materials. However, when it is fabricated from high $T_c$ superconductive materials, the FIG. 5 gradiometer exhibits excessive hysteresis and is very hard to make due to the difficulties associated with high $T_c$ thin film crossover and planar input coil 113. Therefore, it is not advantageous to use the thin film gradiometer of FIG. 5 when fabrication is made using high $T_c$ superconductive materials.

SUMMARY OF THE INVENTION

Given the problems in the prior art, an object of the present invention is to provide a gradiometer which does not exhibit hysteresis, which can be fabricated easily and inexpensively with both high $T_c$ and low $T_c$ superconductive materials, and which provides a a high sensitivity.

A reference magnetometer is rigidly mounted to the sensor magnetometers. The reference magnetometer provides a signal via feedback coils to cancel background magnetic fields from outputs of the sensor magnetometers. Thus, it is not necessary to subtract large voltages to provide a small gradient. Two gradient field signals which do not include the large background magnetic field are subtracted from each other. Thus, a high sensitivity may be obtained by a system which is very inexpensive. The gradiometer is particularly advantageous when high $T_c$ superconductive materials are used for fabrication. Higher order gradiometers can be built using a reference magnetometer cube and a plurality of sensor magnetometer cubes.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENTS

Figure 6:
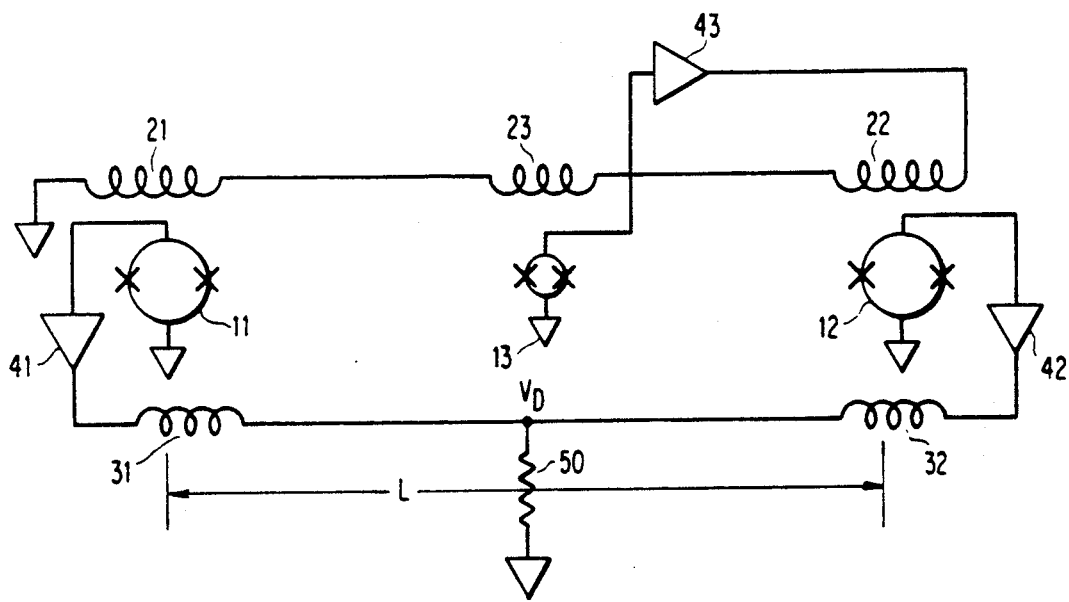
FIG. 6 illustrates a three SQUID gradiometer in one axis according to the present invention.

FIG. 6 illustrates a three SQUID gradiometer in one axis according to one aspect of the present invention. The gradiometer includes three SQUIDs 11, 12, 13. three feedback coils 21, 22, 23, two gradient coils 31, 32, three amplifiers 41, 42, 43 and a resistor 50. SQUIDs 11 and 12 are sensor SQUIDs used to measure the magnetic field at different locations and SQUID 13 is a reference SQUID used to cancel out the background magnetic field (e.g., from the earth's magnetic field) in sensor SQUIDs 11 and 12. The background magnetic field is cancelled out before the subtraction of the measurements of the sensor SQUIDs 11 and 12 is performed.

Reference SQUID magnetometer 13 is rigidly mounted to the two sensor difference SQUIDs 11 and 12. Each of SQUIDs 11 and 12 has two coils associated therewith SQUID 11 has an associated feedback coil 21 and a gradient coil 31 while SQUID 12 has an associated feedback coil 22 and a gradient coil 32.

Reference SQUID magnetometer 13 is operated similarly to magnetometers (SQUIDs) 11 and 12. However, the DC portion of the modulation field for SQUID 13 is applied to all three SQUIDs 11, 12 and 13 via feedback coils 21, 22 and 23. Amplifier 43 is used to apply a magnetic field opposite that of the background magnetic field measured by SQUID 13. Therefore coils 21, 22 and 23 are used to subtract the background magnetic field from SQUID 11, 12 and 13 respectively.

Sensor SQUIDs 11 and 12 are also operated in the usual feedback loop arrangement. However, each of their outputs is equal to the difference between the magnetic field at that sensor SQUID 11 or 12 and the magnetic field at reference SQUID 13. This is due to the cancellation of the uniform field variations each of the sensor SQUIDs 11 and 12 experiences by the feedback signal provided through feedback coils 21, 22 and 23 from reference SQUID 13.

Figure 1:
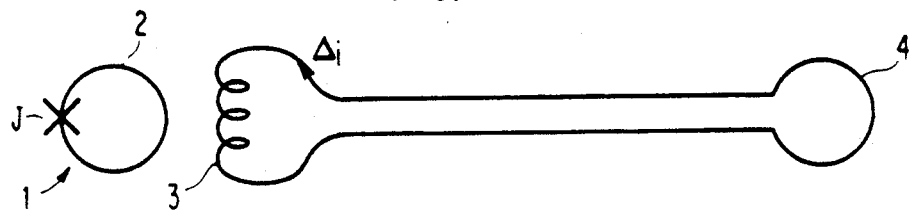
FIG. 1 illustrates a single unlocked SQUID device.
Figure 2:
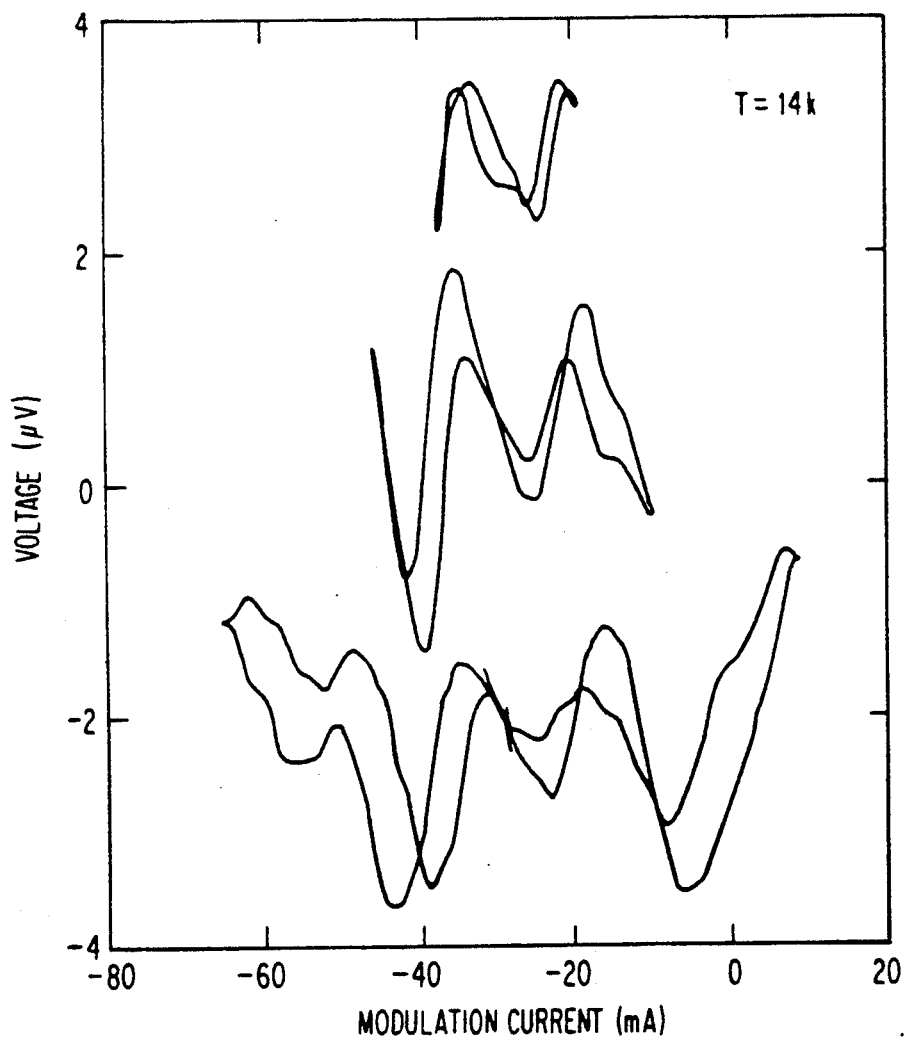
FIG. 2 is a voltage vs. modulation current graph used to illustrate hysteresis present in a single unlocked SQUID device such as the one illustrated in FIG. 1.
Figure 3:
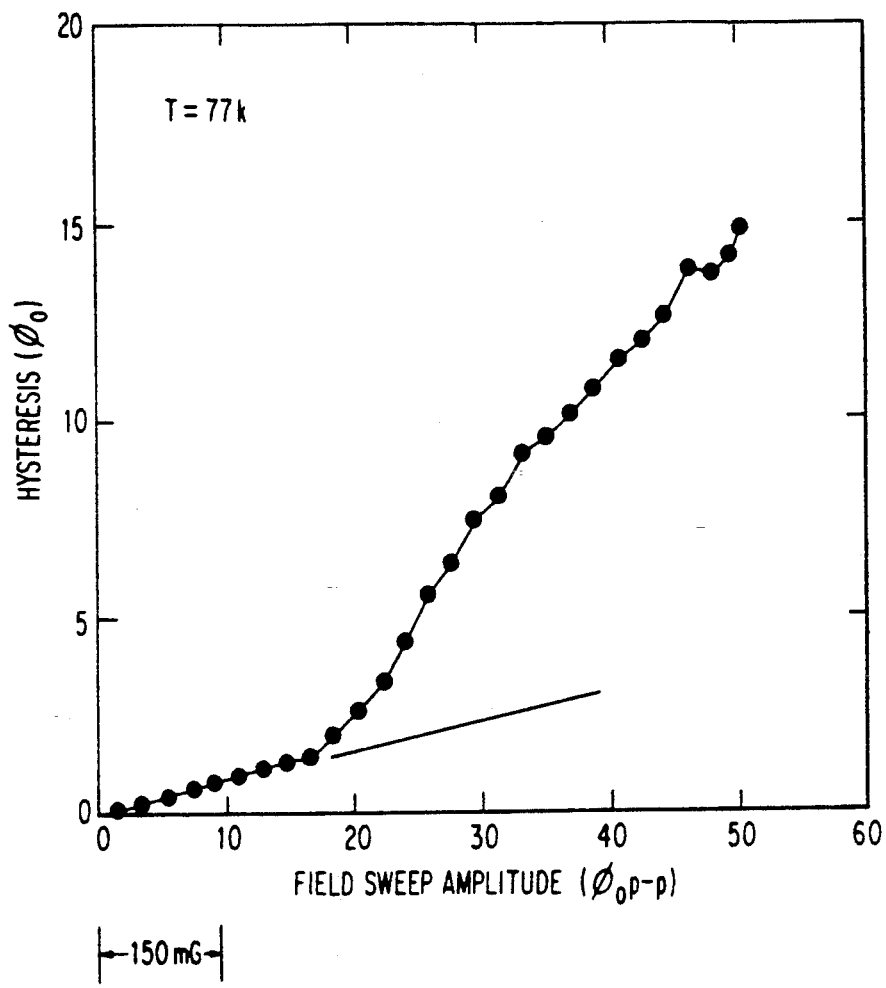
FIG. 3 is a hysteresis vs. field sweep amplitude graph of an unlocked SQUID device.
Figure 4:
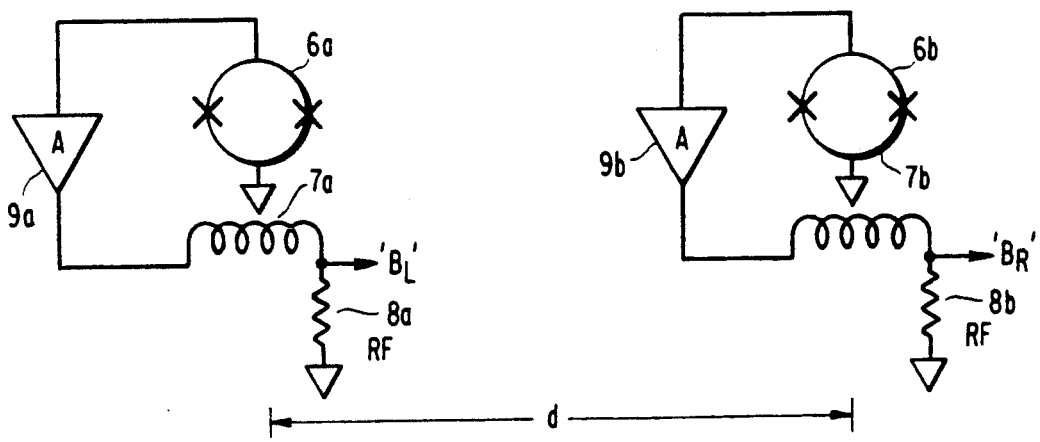
FIG. 4 illustrates a two SQUID gradiometer (or Bare SQUID gradiometer) used to measure a magnetic field gradient.
Figure 5:
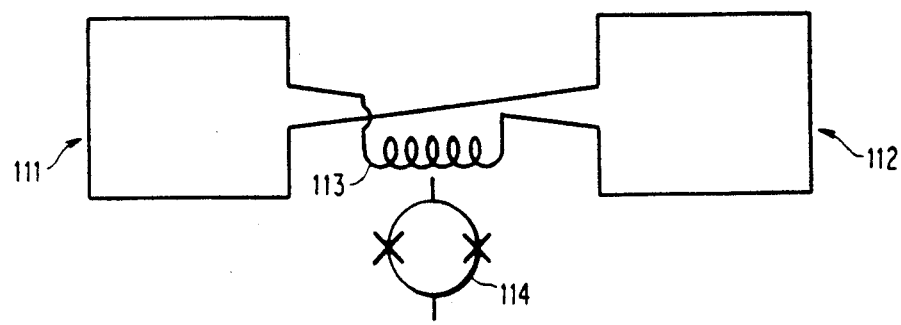
FIG. 5 illustrates a single SQUID thin film gradiometer.

The field gradient measured by the gradiometer of FIG. 6 is obtained by simply subtracting the two sensor SQUID 11 and 12 outputs. These subtracted outputs will be much smaller than the simple magnetometer output signals '$B_R$'' and '$B_L$'' subtracted when using the gradiometer of FIG. 4 and will generally have lower high-frequency components. Thus, the common mode signal (i.e., the degree of imbalance) of this gradiometer is determined only by the mechanical irregularities in the substrates and the superconducting lines making up the system.

A degree of imbalance usual for thin film gradiometers could be obtained by this system (for example, one part in 10,000). Additionally, the usual techniques of adaptive balancing could be used to achieve a balance of one part per billion. If single level SQUIDs utilizing weak links for the Josephson elements are used, the intrinsic balance in all directions would be excellent since no cross-overs are necessary in this system. This system would be very advantageous using high $T_c$ superconductive elements since single level SQUIDs utilizing weak links for the Josephson elements are very common with high $T_c$ superconductive materials.

The arrangement shown in FIG. 6 locks up the feedback coils, the gradient coils and the SQUIDs so that no hysteresis is exhibited in the system. Also, an inexpensive gradiometer may be fabricated using either low $T_c$ or high $T_c$ superconductors.

Using the additional reference magnetometer 13 and the feedback loops in the FIG. 6 gradiometer to couple the SQUID outputs (as opposed to the FIG. 4 gradiometer) yields a result in which the magnetic fields are subtracted prior, to, developing the difference signal in the gradiometer. Without using reference SQUID 13 (as in the FIG. 4 gradiometer). the associated electronics would have to detect the difference between two magnetic fields where the average background field was extremely large. The electronics would be required to detect an extremely small signal difference in the presence of two very large signals. This is very difficult and very costly. Thus by subtracting only the portion of the magnetic fields excluding the background magnetic fields (as opposed to subtracting voltages as done in FIG. 4). the burden on the associated electronics is less and the sensitivity of the gradiometer is much greater. The accuracy of the subtraction (or the balance) only depends on the particular geometry used and could be one part in $10^6$, or better. When relying only on the electronics to detect the difference signal, the sensitivity is much less (e.g., one part in $10^5$).

A major advantage of the FIG. 6 design is that excellent gradient sensitivity may be achieved without hysteresis induced error from using the SQUID and coils.

Three SQUID gradiometers such as the one shown in FIG. 6 will not only be useful in geological operations such as those used to locate oil, but will also be useful in biomedical applications since the only physical constraint on the relative locations of the SQUIDs is that they be rigidly mounted together and that the planes of each SQUID loop are parallel. Thus, almost any gradient may be measured with a compact sensor design. Additionally, an array of SQUIDs may be fed with a reference magnetometer according to the present invention.

Reference SQUID magnetometer 13 may be a SQUID but is not required to be so. The present invention may be practiced using any kind of vector magnetometer in place of reference SQUID magnetometer 13.

In fact, none of SQUIDs 11, 12 and 13 must necessarily be a SQUID. Any vector magnetometer may be used to replace any of the SQUIDs used to describe the preferred embodiment of the present invention. Sensor SQUIDs 11 and 12 may be SQUIDs while reference SQUID 13 may be any kind of vector magnetometer (e.g., a flux gate magnetometer). Additionally, the coils shown in FIG. 6 need not be superconductive.

In the FIG. 6 embodiment, each of sensor SQUIDs 11 and 12 has two feedback coils and the reference SQUID 13 has one coil. However, in practice, each of the SQUIDs 11, 12, 13 could be similar so that the reference SQUID 13 would also have two coils, with one of the coils not being used. Each of the coils used could be a Helmholtz pair, consisting of two loops wired in series, or of a single loop of wire.

Figure 7:
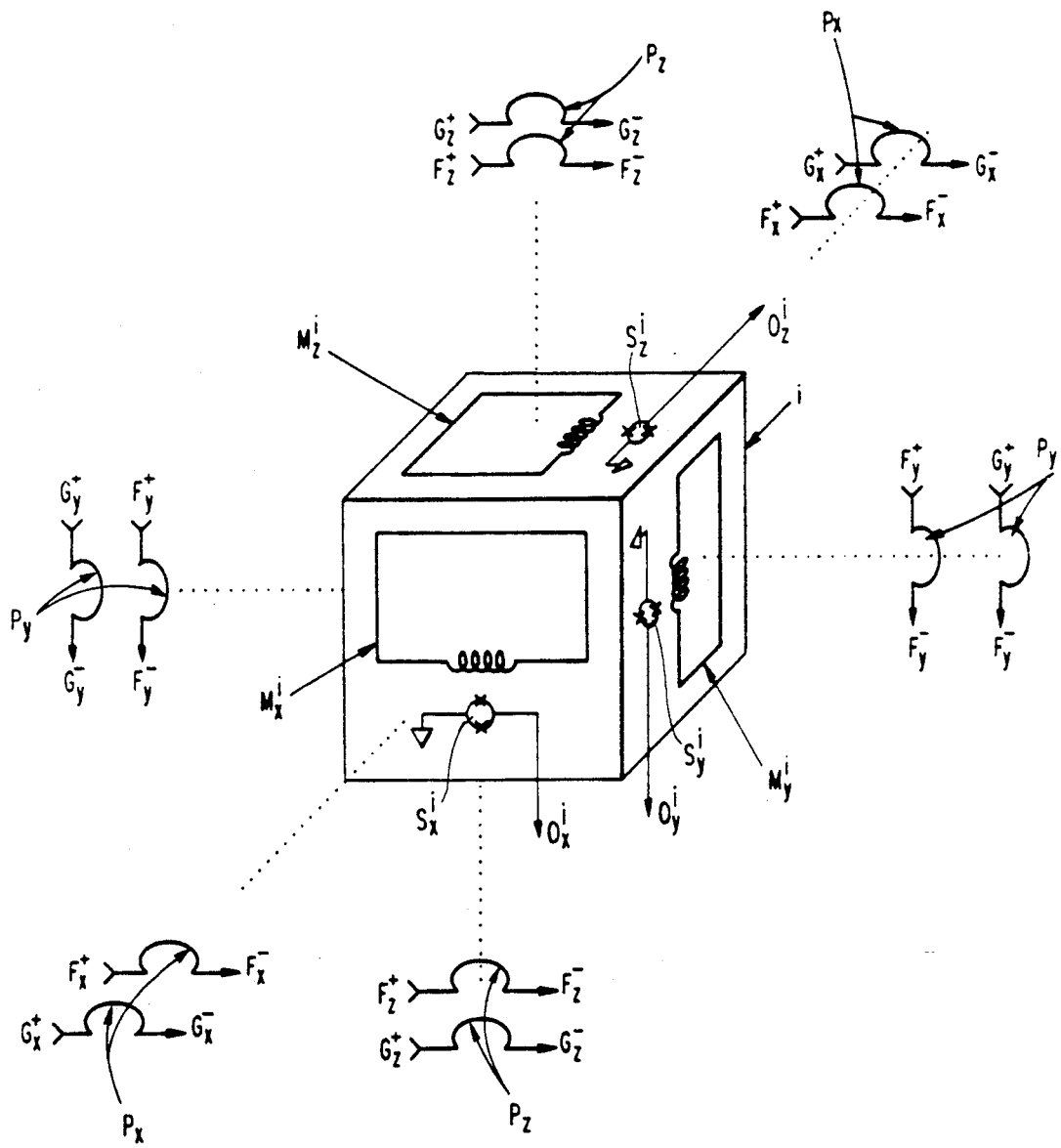
FIG. 7 illustrates a magnetometer cube which could be used to practice the present invention.

FIG. 7 illustrates a magnetometer cube which could be used to practice the present invention. Three magnetometers $M_x^i$, $M_y^i$ and $M_z^i$ include SQUIDS $S_x^i$, $S_y^i$ and $S_z^i$, respectively. Three Helmholtz pairs $P_x$, $P_y$ and $P_z$ are shown which include $F_x$ and $G_x$, $F_y$ and $G_y$, and $F_z$ and $G_z$, respectively. The SQUID outputs $O_x^i$, $O_y^i$ and $O_z^i$ are calculated based on $F_x^i$ and $G_x^i$, $F_y^i$ and $G_y^i$, $F_z^i$ and $G_z^i$, respectively.

Figure 8:
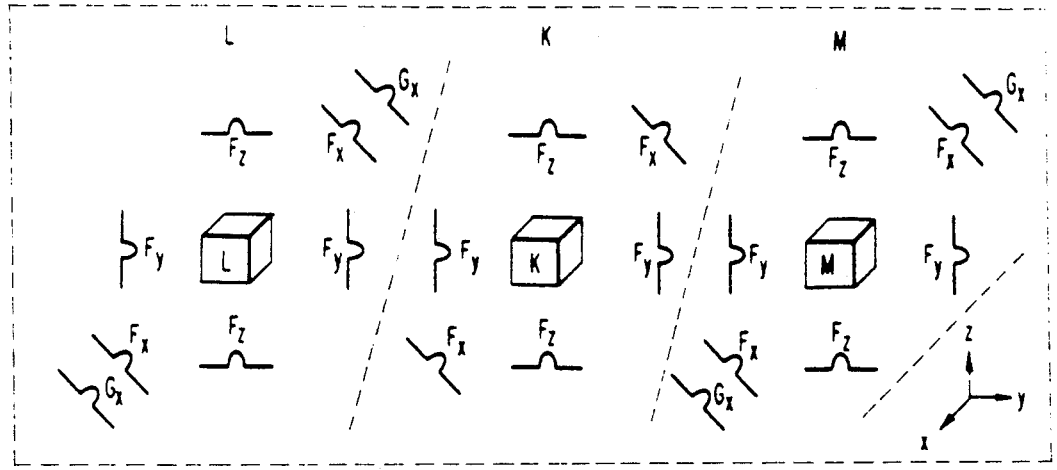
FIG. 8 illustrates a one axis gradiometer according to the present invention using magnetometer cubes similar to the one shown in FIG. 7.

FIG. 8 illustrates a single axis gradiometer using magnetometer cubes similar to the one shown in FIG. 7. The single axis gradiometer illustrated in FIG. 8 includes three magnetometer cubes K, L and M, which are constructed as shown in FIG. 7. Each of the magnetometer cubes K, L and M are arranged in a common line. Magnetometer cube K includes three magnetometers which each have an associated feedback coil. No gradient coil is associated with any of these three magnetometers, since the magnetometers of magnetometer cube K are reference magnetometers.

Magnetometer cubes L and M include three magnetometers each having an associated feedback coil. However, only the x-magnetometers of each of cubes L and M have an associated gradient coil, since FIG. 8 illustrates only a single-axis gradiometer. Therefore, the gradient $G_{xy}$ $$\left(\text{i.e., } \frac{\delta Hx}{\delta y}\right)$$

may be calculated as follows:

$$G_{xy} = \frac{\delta Hx}{\delta y} = (O_x^L - O_x^M)/d$$

where $O_x^L$ and $O_x^M$ (not shown) are the outputs of the X SQUIDS of magnetometers L and M, respectively, and d is the distance between magnetometers L and M.

However, it is advantageous to provide a gradiometer which is at least a five axis gradiometer. A five axis gradiometer is one which measures at least five of the nine gradients for a magnetic field with respect to an x, y and z axis as described below. The reasoning for this is as follows:

In determining a gradient for a magnetic field with respect to an x, y and z axis (i.e., in three dimensions), nine gradients are involved. These nine gradients are:

$$\frac{\delta Hx}{\delta x}, \quad \frac{\delta Hx}{\delta y}, \quad \frac{\delta Hx}{\delta z},$$
$$\frac{\delta Hy}{\delta x}, \quad \frac{\delta Hy}{\delta y}, \quad \frac{\delta Hy}{\delta z},$$
$$\frac{\delta Hz}{\delta x}, \quad \frac{\delta Hz}{\delta y}, \text{ and } \frac{\delta Hz}{\delta z}.$$

This is equivalent to:

$$G_{xx}, \quad G_{xy}, \quad G_{xz},$$
$$G_{yx}, \quad G_{yy}, \quad G_{yz},$$
$$G_{zx}, \quad G_{zy}, \text{ and } G_{zz}.$$

respectively.

However, all nine of these gradients need not be specifically measured by a gradiometer. First, it is known that $\nabla \cdot H = 0$.

It therefore follows that:

$$\frac{\delta Hx}{\delta x} + \frac{\delta Hy}{\delta y} + \frac{\delta Hz}{\delta z} = 0$$

Therefore, only two of $$\frac{\delta Hx}{\delta x}, \frac{\delta Hy}{\delta y}, \text{ and } \frac{\delta Hz}{\delta z}$$

must actually be determined since the other one can be calculated once the other two are known.

Second, it is known that $\nabla \times H \approx 0$. For purposes of the present invention, however, it may be assumed that $\nabla \times H = 0$.
Therefore, $$\frac{\delta Hx}{\delta y} - \frac{\delta Hy}{\delta x} = 0,$$

$$\frac{\delta Hx}{\delta z} - \frac{\delta Hz}{\delta x} = 0, \text{ and}$$

$$\frac{\delta Hy}{\delta z} - \frac{\delta Hz}{\delta y} = 0.$$

Therefore, only one of the two terms from each of these equations must be measured since the terms in the same equation are equal to each other.

Once two terms of the first equation and one term of each of the last three equations are known, all nine terms may be calculated. Therefore, it would be advantageous to have at least a five axis gradiometer so that all nine terms may be determined.

Figure 9:
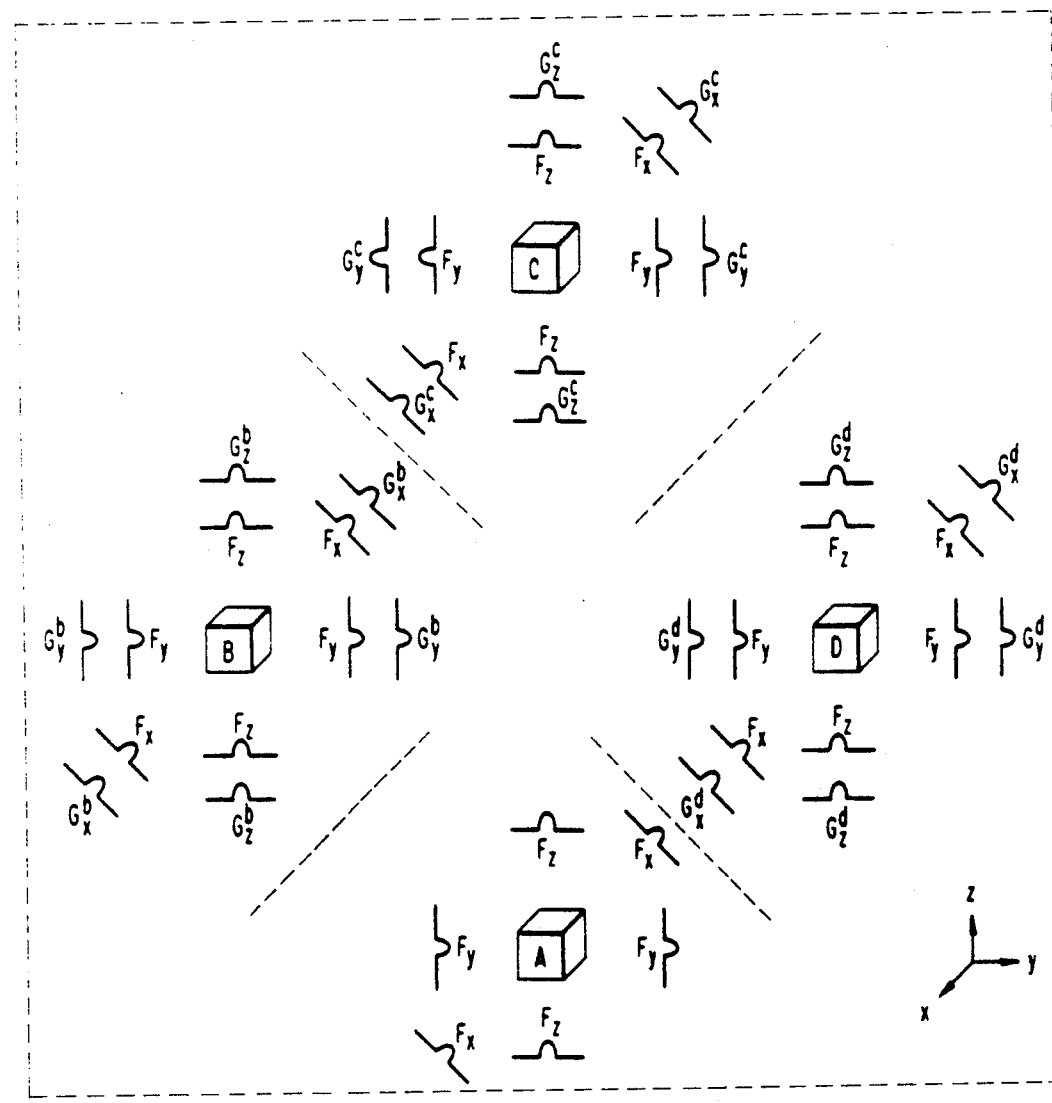
FIG. 9 illustrates a five axis gradiometer according to the present invention using magnetometer cubes such as the one shown in FIG. 7.

FIG. 9 illustrates a five axis gradiometer according to the present invention. The five axis gradiometer includes four magnetometer cubes A, B, C and D arranged in a common plane. The FIG. 9 embodiment uses a higher order gradiometer while practicing the present invention by taking the differences between multiple pairs of difference SQUIDs.

Magnetometer cube A is a reference magnetometer cube having three reference magnetometers and magnetometer cubes B, C and D are the same as magnetometer cube i shown in FIG. 7. The SQUID outputs $O_x^A$, $O_y^A$ and $O_z^A$ (not shown) of magnetometer cube A are provided to the associated feedback coils since no gradient coils are connected for the reference magnetometers of cube A. SQUID outputs $O_x^i$, $O_y^i$ and $O_z^i$ (not shown) (i=B, C, D) are provided to the associated gradient coils as $G_x^i$, $G_y^i$ and $G_z^i$.

The following six gradient terms maybe measured by the five axis gradiometer of FIG. 9, where d is the distance between magnetometer cubes B and D and (d/2) is the vertical distance (i.e., in the Z direction) from the midpoint of the line connecting magnetometer cubes B and D to magnetometer cube C.

$$G_{xy} = \frac{\delta Hx}{\delta y} = (O_x^B - O_x^D)/d$$

$$G_{yy} = \frac{\delta Hy}{\delta y} = (O_y^B - O_y^D)/d$$

$$G_{zy} = \frac{\delta Hz}{\delta y} = (O_z^B - O_z^D)/d$$

$$G_{xz} = \frac{\delta Hx}{\delta z} = \left[\left(\frac{O_x^B + O_x^D}{2}\right) - O_x^C\right]/(d/2)$$

$$G_{yz} = \frac{\delta Hy}{\delta z} = \left[\left(\frac{O_y^B + O_y^D}{2}\right) - O_y^C\right]/(d/2)$$

$$G_{zz} = \frac{\delta Hz}{\delta z} = \left[\left(\frac{O_z^B + O_z^D}{2}\right) - O_z^C\right]/(d/2)$$

Therefore, the gradiometer of FIG. 9 provides six of the nine terms of the gradient. The other three terms can easily be calculated.

The present invention has been described as set forth above using vector magnetometers such as, for example, flux gate magnetometers, SQUIDs, etc. It is preferred that SQUIDs be used to practice the present invention since they have a very high sensitivity. However any type of vector magnetometer may be used to practice the present invention.

It will be apparent to those of working skill in the art that modifications of this invention may be practiced without departing from the essential scope of this invention.

I claim:

1. A gradiometer for measuring a magnetic field gradient, comprising:
   a plurality of sensor magnetometers each producing an output;
   a reference magnetometer rigidly mounted to said plurality of sensor magnetometers, said reference magnetometer generating a reference output for cancelling a background magnetic field from respective outputs of said sensor magnetometers to produce a plurality of cancelled sensor magnetometer outputs; and
   means for providing said magnetic field gradient by performing magnetic subtraction on said cancelled sensor magnetometer outputs.

2. A gradiometer as claimed in claim 1, wherein said sensor magnetometers are Superconducting Quantum Interference Devices (SQUIDS).

3. A gradiometer as claimed in claim 1, wherein said reference magnetometer is a Superconducting Quantum Interference Device (SQUID).

4. A gradiometer as claimed in claim 1, wherein said reference magnetometer provides a feedback signal to cancel said background magnetic field.

5. A gradiometer as claimed in claim 1 wherein each of said sensor magnetometers and said reference magnetometer are Superconducting Quantum Interference Devices (SQUIDs).

6. A gradiometer as claimed in claim 5, wherein said SQUIDs include Josephson elements having weak links.

7. A gradiometer as claimed in claim 5, wherein high $T_c$ superconductive materials are used for fabricating said SQUIDs.

8. A gradiometer as claimed in claim 1, wherein a number of said sensor magnetometers is two.

9. A gradiometer as claimed in claim 1, wherein superconducting loops of each of said magnetometers are parallel to each other.

10. A gradiometer as claimed in claim 1, further comprising a feedback coil associated with each of said sensor magnetometers and said reference magnetometer wherein said feedback coils are used to cancel said background magnetic field.

11. A gradiometer as claimed in claim 1, wherein each of said sensor magnetometers and said reference magnetometer is a magnetometer cube provided with a first magnetometer, a second magnetometer and a third magnetometer on respective non-parallel sides of said magnetometer cube so as to provide a plurality of sensor magnetometer cubes and a reference magnetometer cube.

12. A gradiometer as claimed in claim 11, wherein a number of said sensor magnetometer cubes is three.

13. A gradiometer as claimed in claim 12, wherein said three sensor magnetometer cubes and said reference magnetometer cube are all situated in a common plane.

14. A gradiometer as claimed in claim 11, wherein a number of said sensor magnetometer cubes is two.

15. A gradiometer as claimed in claim 14, wherein said two difference magnetometer cubes and said average magnetometer cube are all situated in a common line.

16. A gradiometer as claimed in claim 11, wherein said gradiometer makes at least a five axis measurement of said magnetic field gradient.

* * * * *